United States Patent

Mitani et al.

[11] Patent Number: 5,804,494
[45] Date of Patent: Sep. 8, 1998

[54] METHOD OF FABRICATING BONDED WAFER

[75] Inventors: Kiyoshi Mitani; Masatake Katayama, both of Takasaki; Kazushi Nakazawa, Nagano, all of Japan

[73] Assignee: Shin-Etsu Handotai Co., Ltd., Tokyo, Japan

[21] Appl. No.: 694,861

[22] Filed: Aug. 9, 1996

Related U.S. Application Data

[63] Continuation of Ser. No. 291,290, Aug. 16, 1994, abandoned.

[30] Foreign Application Priority Data

Aug. 20, 1993 [JP] Japan .................................. 5-206598

[51] Int. Cl.$^6$ .................................................. H01L 21/30
[52] U.S. Cl. .................. 438/455; 438/406; 148/DIG. 12
[58] Field of Search ............. 437/62, 974; 148/DIG. 12; 438/455, 459, 406, 457, 458

[56] References Cited

U.S. PATENT DOCUMENTS

| 4,962,879 | 10/1990 | Goesele et al. | 437/246 |
|---|---|---|---|
| 5,129,827 | 7/1992 | Hoshi et al. | 437/62 |
| 5,196,375 | 3/1993 | Hoshi | 148/DIG. 12 |
| 5,266,135 | 11/1993 | Short et al. | 437/62 |

FOREIGN PATENT DOCUMENTS

| 0603849 | 6/1994 | European Pat. Off. |  |
| 0194520 | 8/1990 | Japan | 148/DIG. 12 |

OTHER PUBLICATIONS

Mitani et al.; "Causes and Prevention of Temperature —Dependent Bubbles in Silicon Wafer Bonding", Japanese Journal of Applied Physics, vol. 30, No. 4, pp. 615–622; Apr. 1991.

Parks et al.; "Characterization of Electronic Devices Employing Silicon Bonding"; First International Symposium on Semi Conductor Wafer Bonding Science, Technology and Applications; 1991, pp. 321–330.

Stevie et al.; "Boron Contamination of Surfaces in Silicon Microelectronics processing: characterization and causes"; J. Vac. Sci. Technol. A 9(5) Sep./Oct. 1991; pp. 2813–2816.

*Primary Examiner*—Trung Dang
*Attorney, Agent, or Firm*—Nikaido Marmelstein Murray & Oram, LLP.

[57] ABSTRACT

A method of fabricating a bonded wafer which is capable of reducing the concentrations of impurities, and more particularly the boron concentration, at the interface of bonding in the bonded wafer, wherein first and second wafers to be bonded are finish-cleaned, then the wafers are temporarily stored in a closed box so as to isolate the wafers from clean-room air, thereafter the first and second wafers are superposed in a clean atmosphere which is held out of direct contact with clean-room air, and finally the superposed first and second wafers are bonded together by a heat-treatment.

20 Claims, 6 Drawing Sheets

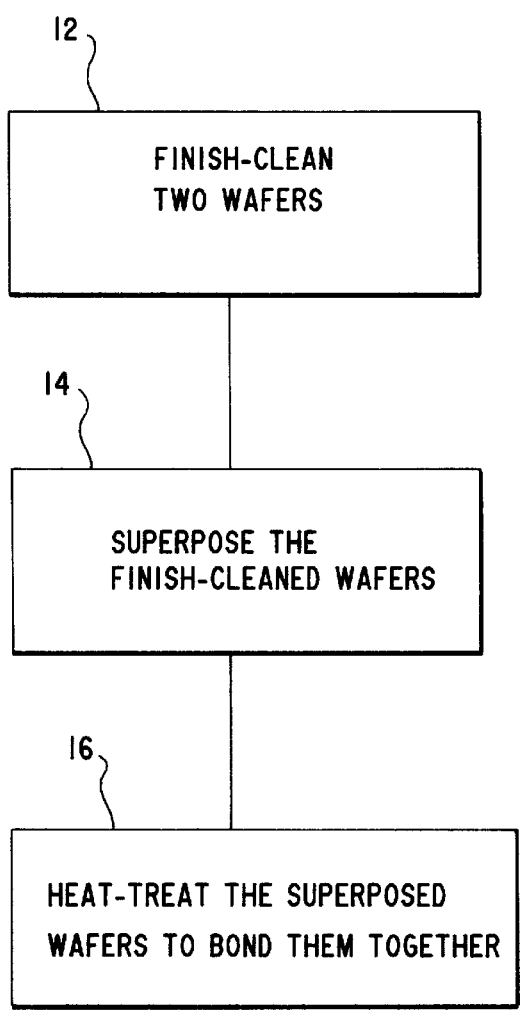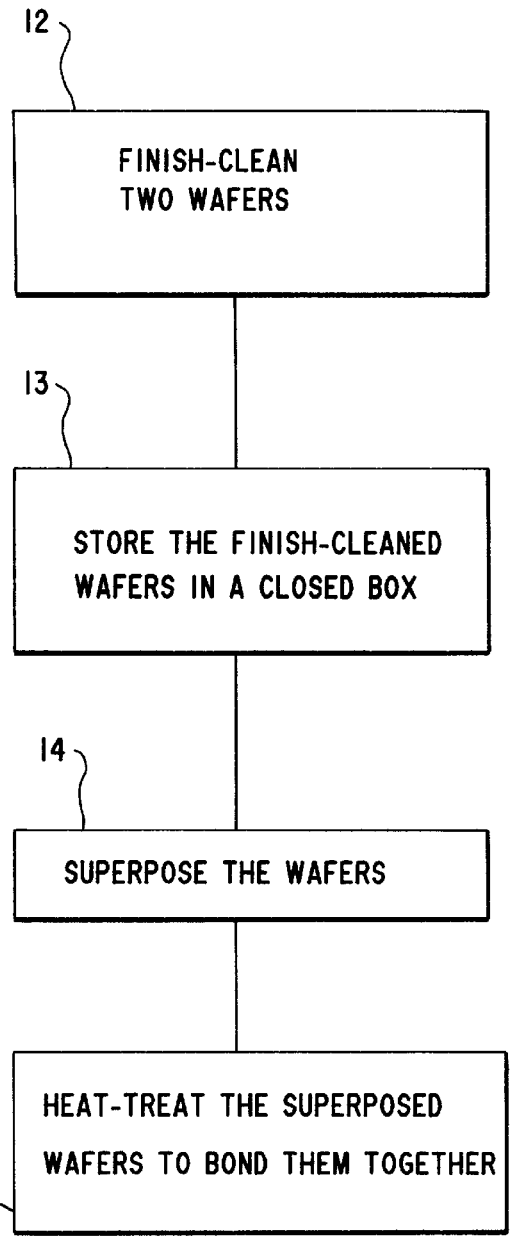

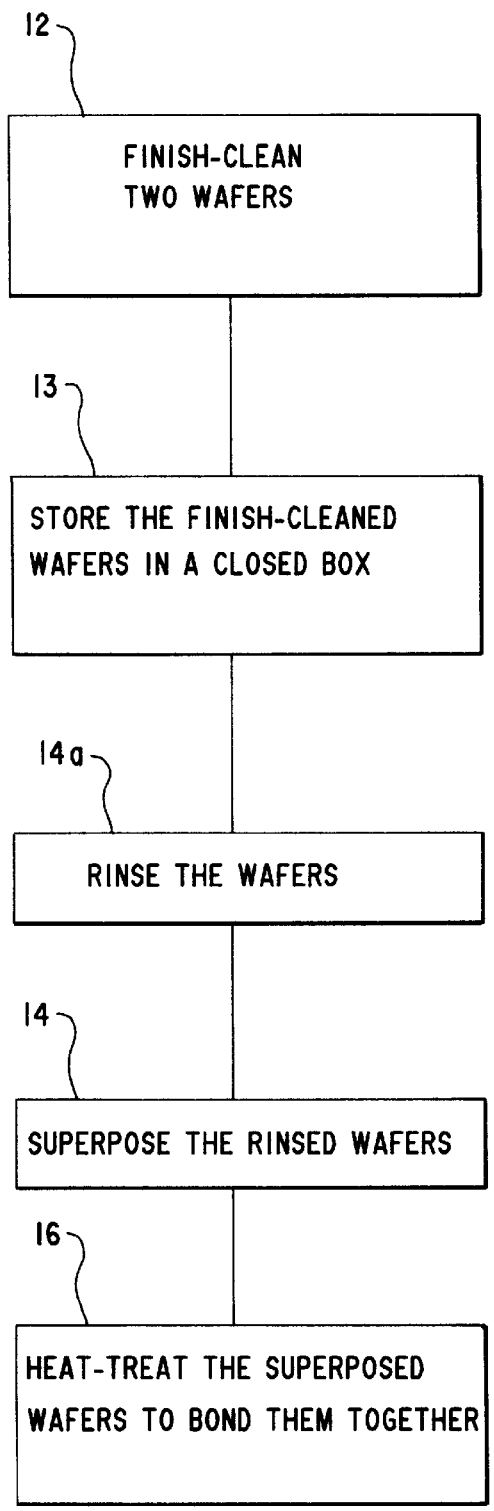
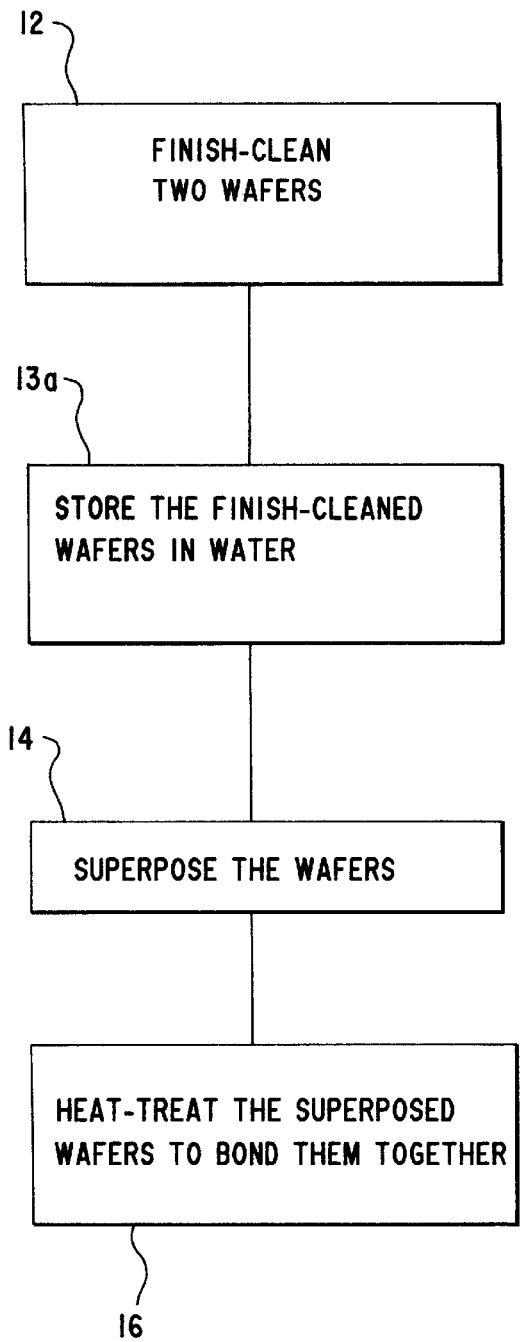

FIG.5
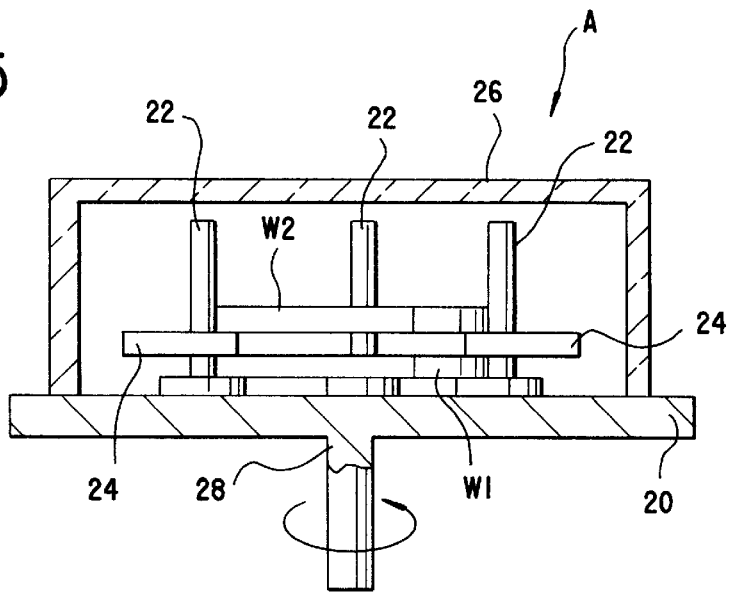
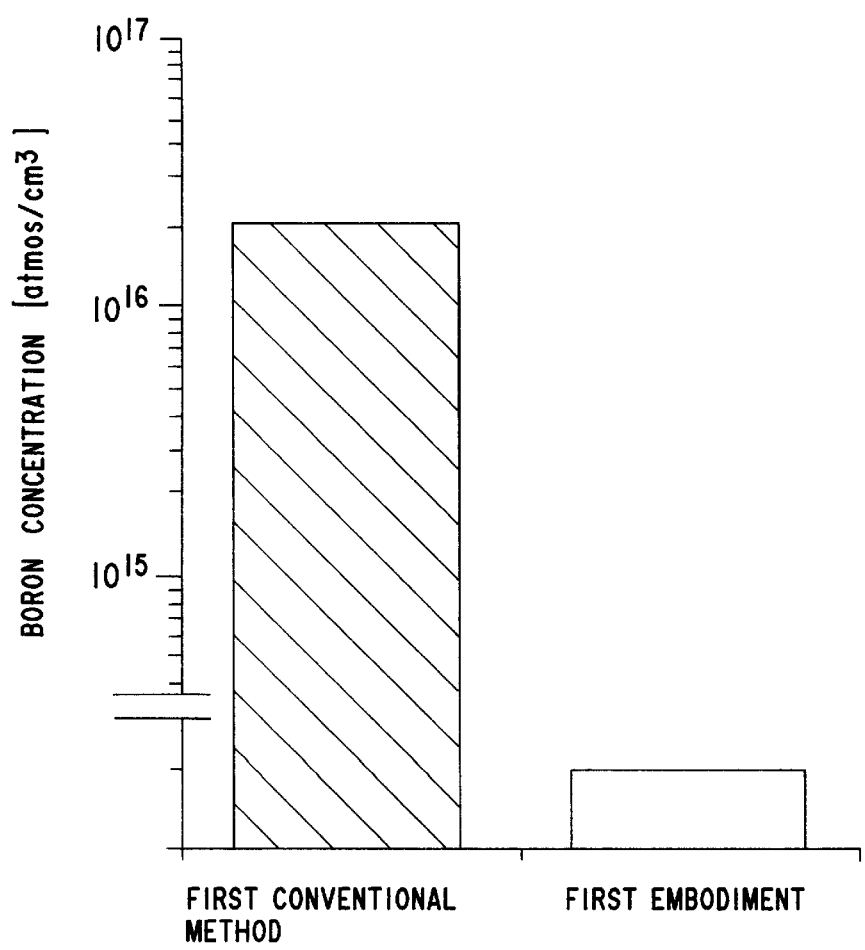
FIG.6

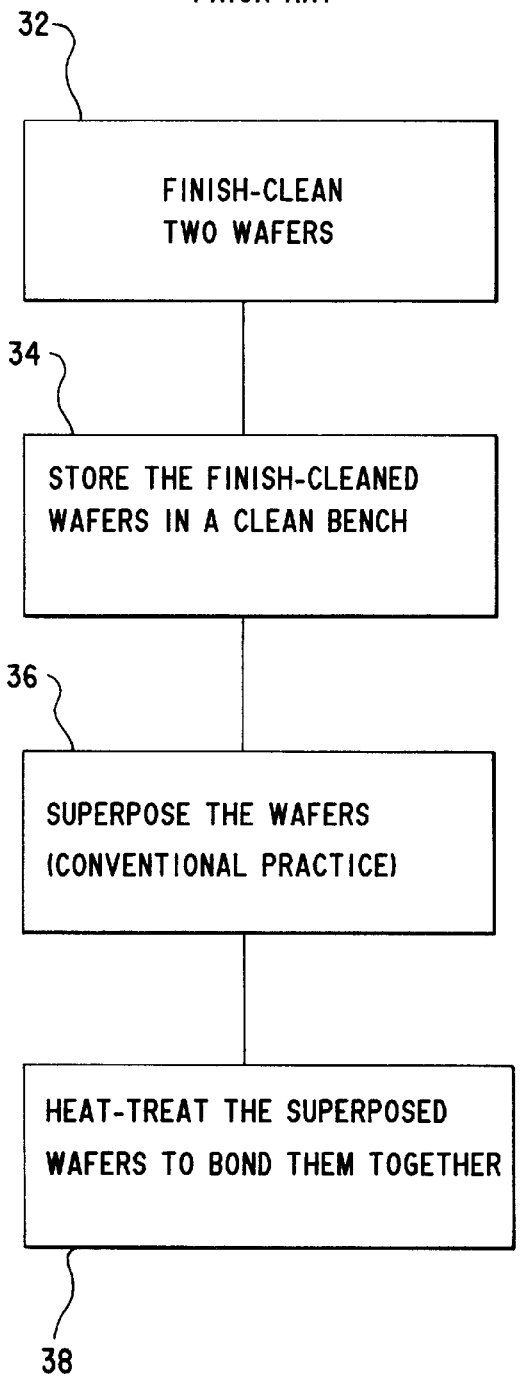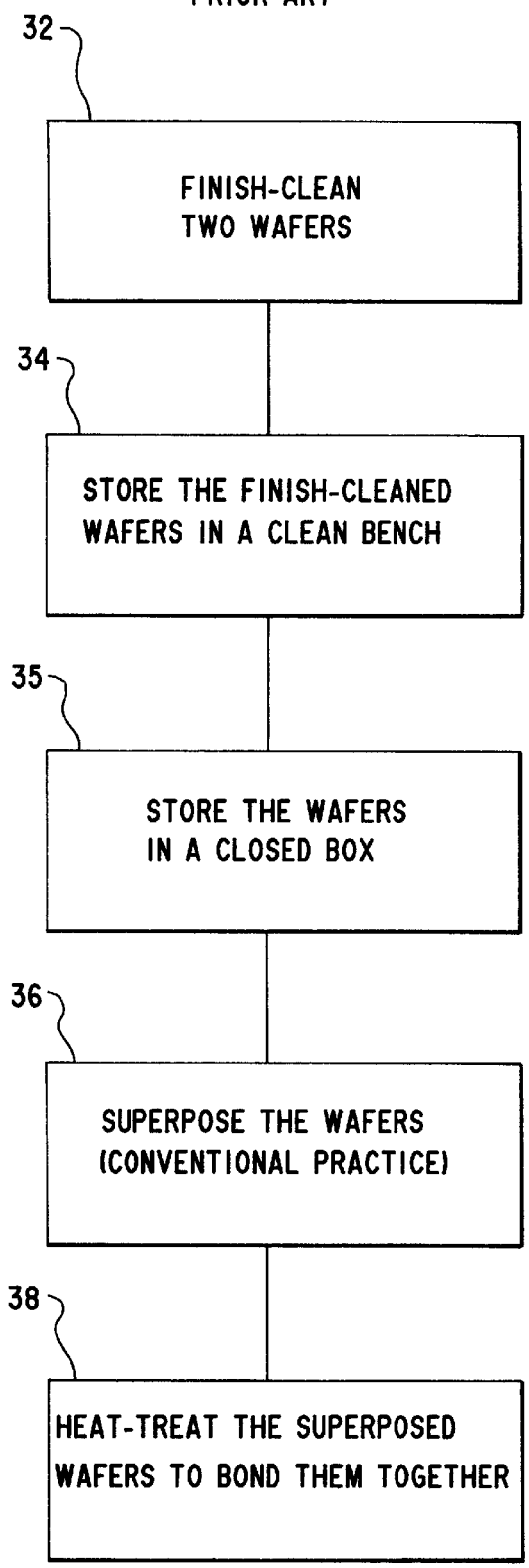

METHOD OF FABRICATING BONDED WAFER

This application is a continuation of application Ser. No. 08/291,290, filed Aug. 16, 1994 now abandoned.

BACKGROUND OF THE INVENTION

1. Field of the Invention

The present invention relates to a method of fabricating a bonded wafer with stable qualities by reducing the concentrations of unnecessary impurities, and more particularly the boron concentration, at the interface of bonding in the bonded wafer.

2. Description of the Prior Art

Bonded wafers are generally classified into two groups depending on the type of bonding; one group being a direct bonding type wafer in which two semiconductor wafers are directly bonded without an insulator between them, and the other group being a so-called SOI (Semiconductor on Insulator) type wafer in which a semiconductor wafer and an insulator wafer are bonded together.

Regarding the direct bonding type wafer, when two wafers to be bonded are comprised of mirror-polished, single-crystalline silicon wafers (hereinafter referred to as "Si wafers"), a pair of mirror-polished surfaces of the Si wafers are placed in contact with each other, and after that the superposed Si wafers are heat-treated to create the strong bonding interface between the two Si wafers. The bonded wafer thus fabricated is equivalent to an epitaxial wafer.

In the fabrication of the SOI type wafer, a surface of at least one of a pair of mirror-polished Si wafers is oxidized to form a silicon dioxide ($SiO_2$) film. Then, two Si wafers are superposed, with the $SiO_2$ film lying between a pair of mirror-polished surfaces of the Si wafers. Subsequent heat-treating at a temperature higher than several hundred degrees completes the bonding between the two Si wafers. The bonded wafer is thinned by grinding and polishing the surface of the wafer. Likewise, a silicon-on-quartz bonded wafer can be also fabricated.

Conventionally, bonded wafers are fabricated by a method shown here in FIG. 8, which method comprises the steps of finish-cleaning two wafers (a step 32), storing or leaving the finish-cleaned wafers in a clean bench for a predetermined period of time (a step 34), subsequently superposing the two wafers while exposing them to air (a step 36), and heat-treating the superposed wafers to bond them together (a step 38).

The bonded wafers fabricated in such a manner must comply the requirements that the bonding between two wafers is uniform and firm, and the interface of bonding is free from impurities which would otherwise contaminate a semiconductor single crystal forming an activated layer.

In reality, however, the bonded wafers involve certain defects which seem to be caused by impurity contamination at the interface of bonding. All the impurities except those already contained in the silicon ingot are introduced mainly through surfaces of two wafers before they are bonded together. This means that the wafer surfaces, as they are exposed, tend to adsorb heavy metals and non-metal impurities which vary the resistivity of the bonded wafer.

Thus, it is likely that the interface of bonding in the bonded wafer introduces various impurities as possibility. If the interface in a bonded wafer is contaminated with heavy metal impurities, the bonded wafer has a short lifetime and an increased number of lattice defects with the result that the yield of semiconductor devices is considerably low.

Furthermore, if the interface of bonding in a bonded wafer is contaminated with an excess amount of boron or phosphorus, the type of conductivity of the bonded wafer may be reversed, or the resistivity of the bonded wafer may be deviated from the designed value, which will vary the performance characteristics of the bonded wafer and eventually lower the reliability of semiconductor devices fabricated from the bonded wafer. To avoid these difficulties, the conventional wafer-superposing step is carried out in such a manner that the wafers are permitted to stand for only the shortest possible time after they are cleaned and dried in a high level clean room. Despite the greatest possible care, the foregoing impurity contamination occurs frequently, and the cause of this has not been cleared up to date.

To fabricate an SOI type wafer, the present inventor carried out the conventional method shown in the FIG. 8 using two Si wafers. The fabricated SOI type wafer had a failure of resistivity of a Si activated layer. A research indicated that the resistivity failure was due to an extraordinarily high concentration of boron impurity at the interface of bonding in the SOI type wafer. The boron concentration at the interface of bonding was measured using SIMS (Secondary Ion Mass Spectroscopy) with the results shown in FIG. 6 where the boron concentration profile in the direction of the depth of the Si activated layer had a peak value greater than $10^{16}$ atoms/cm$^3$.

In addition to the first conventional method just described above, a second conventional method shown in FIG. 9 was also carried out by the present inventor to fabricate an SOI type wafer using two Si wafers. Unlike the first conventional method of FIG. 8, the second conventional method further includes the step 35 of temporarily storing the wafers in a closed box after they are left in a clean bench for a certain period of time and before they are bonded together.

The boron concentration at the interface of bonding in the fabricated SOI type wafer was measured with the results shown in FIG. 7. As shown in FIG. 7, the boron concentration is about $10^{16}$ atoms/cm$^3$. A comparative review of FIGS. 6 and 7 indicates that the boron concentration in the SOI type wafer obtained by the second conventional process is slightly smaller than that in the SOI type wafer obtained by the first conventional process. The reason of this is provably due to the storage of the wafers in the closed box.

According to the conventional method, a bonded wafer is fabricated by first cleaning and drying two wafers, then leaving the cleaned wafers for a certain period of time, subsequently superposing the wafers at the room temperature, thereafter heat-treating the superposed wafers to bond them together with an increased bonding strength, and finally thinning a single-crystalline wafer. In the conventional bonded-wafer fabrication method, no investigation has been carried out so far as the issue of boron contamination is concerned. In view of the presence of boron in the vicinity of the interface of bonding, it is estimated that boron is added before the two wafers are superposed, due to chemicals or pure water used in the wafer cleaning step, or an atmosphere in which the wafers are permitted to stand.

To find out the reason of the boron contamination occurring at the interface of bonding in the SOI type bonded wafer, the relation between the storing time during which the Si wafers are left in a clean bench before bonding, and the boron concentration at the interface of bonding in the SOI type bonded wafer was investigated by the present inventor with the results shown in FIG. 10.

It is apparent from FIG. 10 that at the initial stage of storage, the boron concentration is not much exceeding $10^{15}$ atoms/cm$^3$; for the succeeding several hours, the boron concentration increases with the passage of time; and when the storage time exceeds 10 hours, the boron concentration reaches to a saturated value of $10^{17}$ atoms/cm$^3$. From this it can be estimated that the boron contamination at the interface of bonding in the bonded wafer is caused mainly by the action of air in the clean bench, i.e., clean-room air in the clean room, and not by the cleaning or rinsing process.

It is, therefore, considered that the boron concentration increases as the wafers get more opportunity of coming in contact with air before the bonding. The boron concentration problem can be solved if the air in the clean bench (i.e., clean-room air in the clean room) is completely free of boron. However, since boron is a chemical substance existing in air only in an extremely small amount, complete elimination of such a chemical substance is almost impossible by the existing technique; or if such a boron elimination is possible, it requires a considerably high equipment cost.

SUMMARY OF THE INVENTION

With the foregoing difficulties in the prior art in view, it is an object of the present invention to provide a method of fabricating a bonded wafer, which is able to reduce the concentrations of unnecessary impurities, and more particularly the boron concentration, at the interface of bonding in the bonded wafer, thereby improving the qualities of the bonded wafer.

To attain the foregoing object, the present invention provides a method of fabricating a bonded wafer, comprising the steps of: finish-cleaning first and second wafers; temporarily storing the finish-cleaned first and second wafers in a closed box to isolate the first and second wafers from clean-room air; superposing the first and second wafers in a clean atmosphere which is held out of contact with clean-room air; and heat-treating the superposed first and second wafers to bond them together. The closed box is so constructed as to completely isolate the wafers from the clean-room air. A more positive effect can be attained by replacing the inside of the closed box by ultrapure $N_2$ gas or the like.

The cleaned first and second wafers may be stored in water, and then the wet first and second wafers are dried immediately before they are superposed.

The method of the present invention includes the step of holding first and second wafers out of direct contact with air containing boron, so as to reduce the concentrations of impurities, and more particularly the boron concentration, at the interface of bonding in a bonded wafer.

More particularly, the method of the invention has two important features described below.

(1) In the conventional superposing process, direct contact between two wafers and air containing boron is unavoidable. However, the present invention completely isolates the wafers from air in a clean room (clean-room air) by using a superposing apparatus which also serves as a rinsing device, a spin-dryer and a closed box.

(2) The conventional method includes the step of storing finish-cleaned wafers in a clean bench which is thought to be clean. As opposed to the conventional method, the method of the present invention stores the finish-cleaned wafers in water instead of drying the wafers, or stores the finish-cleaned wafers in a closed box after drying. In either case, since the stored wafers are immediately put into a superposing process with the result that the boron contamination caused by direct contact between the wafers, air in the clean bench (clean-room air) is completely eliminated.

The above and other objects, features and advantages of the present invention will become manifest to those versed in the art upon making reference to the detailed description and the accompanying sheets of drawings in which preferred structural embodiments incorporating the principles of the present invention are shown by way of illustrative example.

BRIEF DESCRIPTION OF THE DRAWINGS

FIG. 1 is a flow chart showing a sequence of processing steps taken to carry out a first embodiment of the invention for fabricating a bonded wafer;

FIG. 2 is a flow chart showing a sequence of processing steps taken to carry out a second embodiment of the present invention;

FIG. 3 is a flow chart showing a sequence of processing steps taken to carry out a third embodiment of the present invention;

FIG. 4 is a flow chart showing a sequence of processing steps taken to carry out a fourth embodiment of the present invention;

FIG. 5 is a partly cross-sectional, front elevational view of a superposing apparatus used to carry out the method of the present invention;

FIG. 6 is a graph showing the boron concentration of a bonded wafer made in accordance with the first embodiment of the present invention and that of a bonded wafer according to a first conventional method;

FIG. 8 is a flow chart showing a sequence of processing steps taken to carry out the first conventional method;

FIG. 9 is a flow chart showing a sequence of processing steps taken to carry out the second conventional method.

DETAILED DESCRIPTION OF THE INVENTION

Certain preferred embodiments of the present invention will be described below with reference to FIGS. 1 through 7.

FIG. 1 is a flow chart showing a sequence of processing steps achieved in first embodiment of a method according to the present invention. In FIG. 1, numeral 12 denotes a wafer finish-cleaning step wherein first and second mirror-polished wafers are cleaned by treating them with a chemical. After this treatment, a hydrophilic surface is formed on the surface of each wafer.

Numeral 14 denotes a superposing step in which a superposing apparatus (FIG. 5) is used to superpose the finish-cleaned first and second wafers, immediately after the finish-cleaning step, under a condition which is isolated from air in a clean room.

Numeral 16 denotes a bonding heat-treating step wherein the superposed first and second wafers are bonded together by heat-treating them under a predetermined condition, for example, in an atmosphere of wet $O_2$ at 1100° C. for 30 min.

Using two Si wafers, the steps 12–16 in the first embodiment shown in FIG. 1 were carried out to fabricate an SOI type wafer. The boron concentration at the interface of bonding in the fabricated SOI type wafer was measured with the results shown in FIG. 6. As evidenced from FIG. 6, the boron concentration at the interface of bonding in the SOI type wafer fabricated in accordance with the first embodiment shown in FIG. 1 is less than a limit of detection of SIMS ($5 \times 10^{14}$ atoms/cm$^3$) indicated by the broken line. It is confirmed that the first embodiment of the method of the present invention provides an incomparably greater reduction of the boron concentration than that provided by the first conventional method.

FIG. 2 is a flow chart showing a sequence of processing steps achieved in a second embodiment of the present invention. In the second embodiment, a wafer finish-cleaning step 12 is followed by a storing step 13 in which the finish-cleaned first and second wafers are stored in a closed box instead of being left in a clean bench. The wafers which are temporarily stored in a closed box are taken out from the closed box and, immediately thereafter, they are superposed by a superposing step 14. The superposed wafers are bonded together by a bonding heat-treating step 16 in the same manner as the first embodiment described above.

Figure 7:
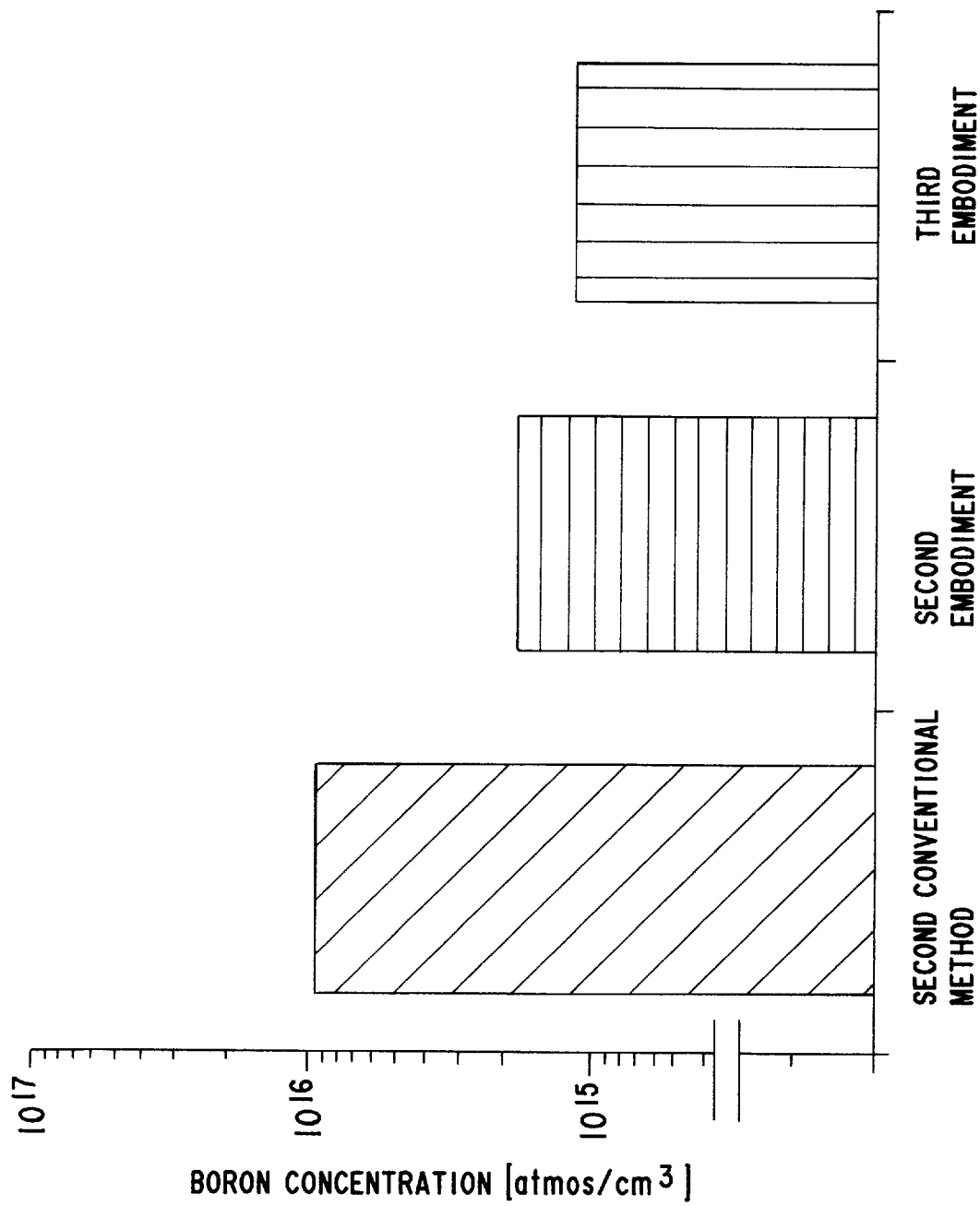
FIG. 7 is a graph showing the boron concentration of bonded wafers made in accordance with the second and third embodiments of the present invention and that of a bonded wafer according to a second conventional method.
Figure 10:
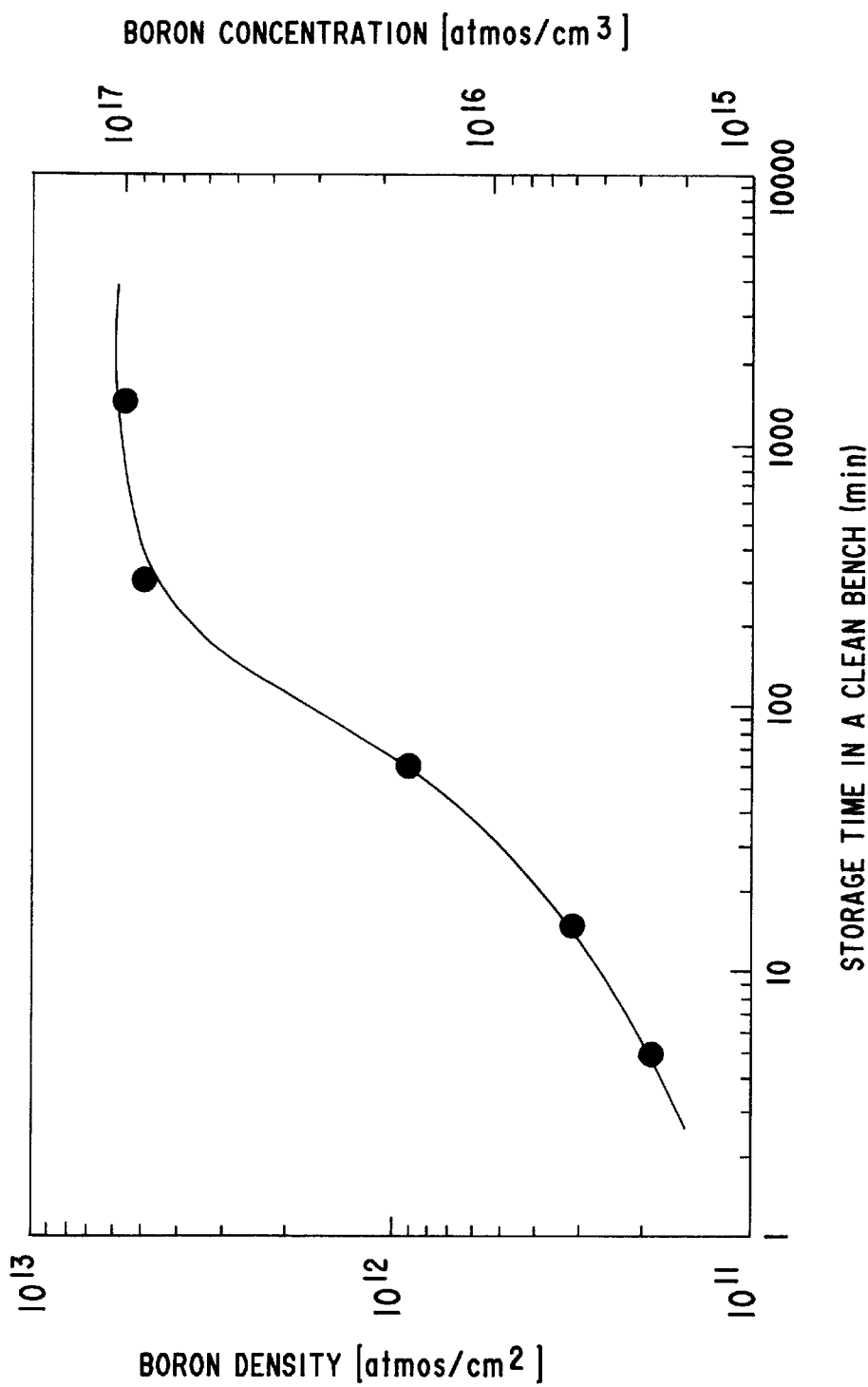
FIG. 10 is a graph showing the relation between the storage time of two Si wafers inside a clean bench, and the boron concentration at the interface of bonding in an SOI type bonded wafer.

Using two Si wafers, the steps 12, 13, 14 and 16 in the second embodiment shown in FIG. 2 were achieved to fabricate an SOI type wafer. Regarding the fabricated SOI type wafer, the boron concentration at the interface of bonding was measured with the results shown in FIG. 7. As shown in FIG. 7, the boron concentration at the interface of bonding in the SOI type wafer fabricated by the second embodiment of the present invention is about $2 \times 10^{15}$ atoms/cm$^3$ which is considerably smaller than that of the bonded wafer fabricated by the second conventional method.

A third embodiment shown in FIG. 3 is a modification of the second embodiment of FIG. 2. Between the storing step 13 and the superposing step 14, a rinsing step 14a for rinsing the wafers for 15 min is added to the second embodiment. The rinsing step 14a is incorporated on account of the fact that boron adsorbed on the wafer surface can be dissolved or removed by rinsing. As to an SOI type wafer fabricated in the third embodiment, a measurement of the boron concentration at the interface of bonding was made with the results shown in FIG. 7. As is apparent from FIG. 7, the measured boron concentration is of the order of $1 \times 10^{15}$ atoms/cm$^3$ and hence a further reduction of the boron concentration can be attained by the third embodiment.

FIG. 4 is a flow chart showing a sequence of processing steps achieved in a fourth embodiment of the present invention. In this embodiment, the finish-cleaned first and second wafers are not dried but stored in a rinsing bath (a step 13a). After the underwater storage, the first and second wafers are superposed by a superposing step 14 which also includes a spin-drying step.

Using two wafers, the processing steps 12, 13a, 14 and 16 in the forth embodiment were carried out to fabricate an SOI type wafer. The boron concentration at the interface of bonding in the fabricated SOI type wafer was measured using SIMS. The measurement indicated that the boron concentration was under the detection limit of SIMS, as in the case of the first embodiment shown in FIG. 6. It is, therefore, confirmed that a much greater reduction of the boron concentration can be attained by the fourth embodiment of the present invention.

Referring now to FIG. 5, description will be given of a water-seal superposing apparatus which is effectively used to carry out the method of the present invention.

The water-seal superposing apparatus generally designated by A shown in FIG. 5 includes a turn table 20, and three guide rods 22 vertically disposed on an upper surface of the turn table 20 and circumferentially spaced at equal intervals about an axis of rotation of the turn table 20. A first wafer W1 and a second wafer W2 are placed in a space defined by the three guide rods 22 and they are vertically slidably movable along the guide rods 22. Three spacers 24 are rotatably and eccentrically mounted on the guide rods 22, respectively, for temporarily supporting thereon one of the first and second wafers (second wafer W2 in the illustrated embodiment) to vertically separate the two wafers W1 and W2 by a distance of 1 to 2 mm.

A cup-like transparent cover 26 is mounted on the turn table 20 to enclose the guide rods 22, first and second wafers W1, W2 and spacers 24 in a sealed or closed condition. Before the transparent cover 26 is closed, pure water is forced through the space between the first and second wafers W1 and W2 to wash away particles from a pair of opposed surfaces of the wafers W1, W2. Then, the space between the first and second wafers W1, W2 is filled with pure water to hold the opposed surfaces of the wafers W1, W2 out of contact with air. While keeping this condition, the transparent cover 26 is closed to seal the inside of the cover 26.

The turn table 20 has a vertical shaft 28 extending downwardly from the underside thereof. By rotating the shaft 28, the turn table 20 rotates to remove pure water from the wafers W1, W2 by spin-drying operation. The spin-drying time can be reduced by irradiating the wafers W1, W1 with infrared rays emitted from an infrared lamp (not shown) disposed outside the transparent cover 26.

The water-seal superposing apparatus A of the foregoing construction operates as follows. A first wafer W1 is set between the guide rods 22, and then a second wafer W2 is set directly above the first wafer W1 via the spacers 24, as shown in FIG. 5. Subsequently, pure water is forced into a space between the first and second wafers W1 and W2 so that any particles adsorbed on the opposed surfaces of the wafers W1, W2 are washed away or removed and the space is filled with pure water. Then, the transparent cover 26 is attached to the turn table 20 to hermetically seal the inside of the cover 26.

Thereafter, the turn table 20 is rotated to remove pure water by spin-drying. While keeping the sealed condition of the inside of the cover 26, the eccentric spacers 24 are turned through a predetermined angle so as to permit the second wafer W2 to slide down along the guide rods 24 until a pair of opposed surfaces of the first and second wafers W1 and W2 are placed in mutual contact with each other. The first and second wafers W1, W2 are thus superposed together. The water-seal superposing apparatus A is advantageous in that a film of pure water formed on the opposed surfaces of the wafers W1, W2 protects the wafer surfaces from contamination with boron.

The superposing apparatus described above is of the type disclosed by K. Mitani et al in Japanese Journal of Applied Physics, Vol. 30, No. 4, pages 615–622, April, 1991, and is used herein as the function of the apparatus meets the object of the present invention. The superposing apparatus may be replaced by a clean bench which includes a local space replaced or filled with a ultrapure $N_2$ gas and containing appropriate equipment to achieve the spin-drying operation and the superposing operation.

As described above, according to the method of the present invention, the concentrations of impurities, and more particularly the boron concentration, at the interface of bonding in a bonded wafer can be reduced very much so that the quality of the bonded wafer is greatly improved. As a result, it becomes possible to replace the interface of bonding in the bonded wafer by an SOI layer and a buried oxide layer and to superpose a base wafer and a patterned wafer or two patterned wafers together, thereby facilitating fabrication of semiconductor devices having three-dimensionally complicated construction.

Obviously, various minor changes and modifications of the present invention are possible in the light of the above teaching. It is therefore to be understood that within the scope of the appended claims the invention may be practiced otherwise than as specifically described.

What is claimed is:

1. A method of fabricating a bonded wafer, comprising the steps of:
   (a) finish-cleaning first and second wafers;
   (b) superposing the finish-cleaned first and second wafers in a clean atmosphere which is held out of direct contact with clean-room air in a superposing apparatus comprising an enclosed box, means for supplying fluid to the inside of the enclosed box, and a turntable positioned inside the enclosed box, said clean atmosphere consisting essentially of ultrapure $N_2$ gas, thereby preventing boron in the clean-room air from depositing on the wafers; and
   (c) heat-treating the superposed first and second wafers to bond them together at an interface between said first and second wafers,
   thereby obtaining a bonded wafer in which said interface has a boron concentration which is lower than if said superposing were conducted in said clean-room air.

2. A method of fabricating a bonded wafer, comprising the steps of:
   (a) finish-cleaning first and second wafers;
   (b) temporarily storing the finish-cleaned first and second wafers in a closed box so as to isolate the first and second wafers from clean-room air, thereby preventing boron in the clean-room air from depositing on the wafers;
   (c) thereafter, superposing the first and second wafers in a clean atmosphere which is held out of direct contact with clean-room air in a superposing apparatus comprising an enclosed box, means for supplying fluid to the inside of the enclosed box, and a turntable positioned inside the enclosed box, said clean atmosphere consisting essentially of ultrapure $N_2$ gas; and
   (d) heat-treating the superposed first and second wafers to bond them together at an interface between said first and second wafers,
   thereby obtaining a bonded wafer in which said interface has a boron concentration which is lower than if said superposing were conducted in said clean-room air.

3. A method of fabricating a bonded wafer, comprising the steps of:
   (a) finish-cleaning first and second wafers;
   (b) temporarily storing the finish-cleaned first and second wafers in a closed box so as to isolate the first and second wafers from clean-room air, thereby preventing boron in the clean-room air from depositing on the wafers;
   (c) thereafter, rinsing the first and second wafers;
   (d) superposing the rinsed first and second wafers in a clean atmosphere which is held out of direct contact with clean-room air in a superposing apparatus comprising an enclosed box, means for supplying fluid to the inside of the enclosed box, and a turntable positioned inside the enclosed box, said clean atmosphere consisting essentially of ultrapure $N_2$ gas; and
   (e) heat-treating the superposed first and second wafers to bond them together at an interface between said first and second wafers,
   thereby obtaining a bonded wafer in which said interface has a boron concentration which is lower than if said superposing were conducted in said clean-room air.

4. A method of fabricating a bonded wafer, comprising the steps of:
   (a) finish-cleaning first and second wafers;
   (b) submerging the finish-cleaned first and second wafers in water so as to isolate the finish-cleaned first and second wafers from clean-room air, thereby preventing boron in the clean-room air from depositing on the wafers;
   (c) drying the stored first and second wafers in a clean atmosphere which is held out of direct contact with clean-room air, said clean atmosphere consisting essentially of ultrapure $N_2$ gas;
   (d) immediately after the drying, superposing the first and second wafers in said clean atmosphere; and
   (e) heat-treating the superposed first and second wafers to bond them together at an interface between said first and second wafers,
   thereby obtaining a bonded wafer in which said interface has a boron concentration which is lower than if said superposing were conducted in said clean-room air.

5. A method of fabricating a bonded wafer as recited in claim 4, wherein said superposing the first and second wafers in step (d) is carried out in a superposing apparatus comprising an enclosed box, means for supplying fluid to the inside of the enclosed box, and a turntable positioned inside the enclosed box.

6. A method as recited in claim 1, wherein said interface has a boron concentration less than $10^{16}$ atoms/cm$^3$.

7. A method as recited in claim 1, wherein said interface has a boron concentration less than $5\times10^{14}$ atoms/cm$^3$.

8. A method as recited in claim 1, wherein said interface has a boron concentration of about $2\times10^{15}$ atoms/cm$^3$ or less.

9. A method as recited in claim 1, wherein said interface has a boron concentration of about $10^{15}$ atoms/cm$^3$ or less.

10. A method as recited in claim 1, wherein said wafers are wet when they are being placed in said superposing apparatus.

11. A method as recited in claim 2, wherein said wafers are wet when they are being placed in said superposing apparatus.

12. A method as recited in claim 3, wherein said wafers are wet when they are being placed in said superposing apparatus.

13. A method as recited in claim 2, wherein said interface has a boron concentration less than $10^{16}$ atoms/cm$^3$.

14. A method as recited in claim 3, wherein said interface has a boron concentration less than $10^{16}$ atoms/cm$^3$.

15. A method as recited in claim 4, wherein said interface has a boron concentration less than $10^{16}$ atoms/cm$^3$.

16. A method as recited in claim 4, wherein said interface has a boron concentration less than $5\times10^{14}$ atoms/cm$^3$.

17. A method as recited in claim 4, wherein said interface has a boron concentration of about $2\times10^{15}$ atoms/cm$^3$ or less.

18. A method as recited in claim 2, wherein said interface has a boron concentration of about $10^{15}$ atoms/cm$^3$ or less.

19. A method as recited in claim 3, wherein said interface has a boron concentration of about $10^{15}$ atoms/cm$^3$ or less.

20. A method as recited in claim 4, wherein said interface has a boron concentration of about $10^{15}$ atoms/cm$^3$ or less.

* * * * *